(12) United States Patent  
Rao et al.

(10) Patent No.: US 9,349,421 B2  
(45) Date of Patent: May 24, 2016

(54) MEMORY INTERFACE

(71) Applicant: Kool Chip, Inc., San Jose, CA (US)

(72) Inventors: Venkata N. S. N. Rao, Fremont, CA (US); Prasad Chalasani, San Jose, CA (US)

(73) Assignee: SOCTRONICS, INC., Santa Clara, CA (US)

( * ) Notice: Subject to any disclaimer, the term of this patent is extended or adjusted under 35 U.S.C. 154(b) by 245 days.

(21) Appl. No.: 14/171,646

(22) Filed: Feb. 3, 2014

(65) Prior Publication Data

US 2015/0221350 A1 Aug. 6, 2015

(51) Int. Cl.

| | |
|---|---|
| *G11C 8/00* | (2006.01) |
| *G11C 7/10* | (2006.01) |
| *G11C 7/22* | (2006.01) |
| *G06F 13/16* | (2006.01) |
| *G11C 29/02* | (2006.01) |

(52) U.S. Cl.
CPC .......... *G11C 7/1093* (2013.01); *G06F 13/1689* (2013.01); *G11C 7/22* (2013.01); *G11C 29/022* (2013.01); *G11C 29/023* (2013.01); *G11C 29/028* (2013.01)

(58) Field of Classification Search
CPC .......... G11C 7/1093; G11C 7/22; G11C 8/18; G06F 13/1689
See application file for complete search history.

(56) References Cited

U.S. PATENT DOCUMENTS

| | | | |
|---|---|---|---|
| 2007/0274218 A1* | 11/2007 | Swenson et al. | 370/235 |
| 2014/0314190 A1* | 10/2014 | Chalasani et al. | 375/355 |
| 2015/0063008 A1* | 3/2015 | Moon et al. | 365/154 |

* cited by examiner

*Primary Examiner* — Richard Elms  
*Assistant Examiner* — Mohammed A Bashar  
(74) *Attorney, Agent, or Firm* — Venture Pacific Law, PC

(57) ABSTRACT

A data path interface for transferring data to a memory device, comprising: programmable delay units ("PDUs"), wherein data is received by the interface according to a first clock signal and wherein the PDUs apply delays to the received data; and align blocks, wherein the align blocks select certain ones of the delayed data as a function of the first clock signal and a second clock signal, and wherein the selected certain ones of the delayed data are processed for transmission to the memory device according to the second clock signal.

14 Claims, 9 Drawing Sheets

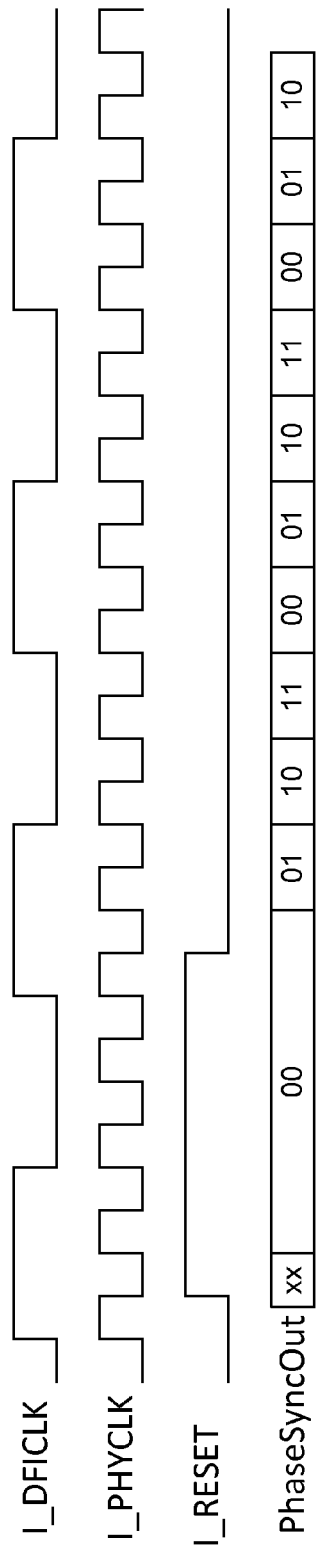
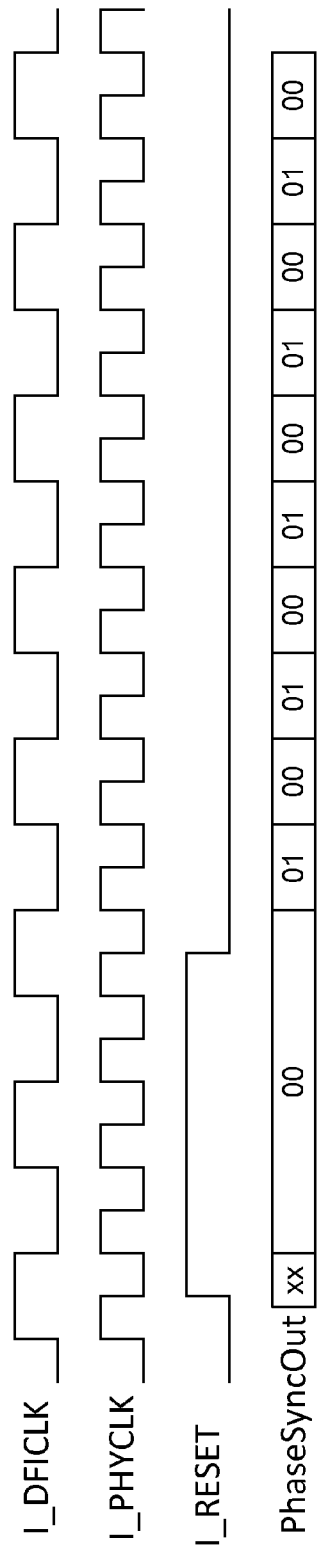
Fig. 2a
Fig. 2b

MEMORY INTERFACE

FIELD OF INVENTION

This invention generally relates to methods and systems for integrated circuits ("ICs") and, in particular, to methods and systems for a memory interface between a physical layer of the ICs and a memory device.

BACKGROUND

Many computing devices (and other ICs) use multiple clock domains for various modules of the computing device. For instance, a data-transmitting module of a computing device might be operating in a first clock domain at a first clock frequency, while a data-receiving module of the computing device can be operating in a second clock domain at a second clock frequency. Furthermore, the second clock frequency may be asynchronously running relative to the first clock frequency.

Since the transmitting and receiving modules reside in different clock domains, the rate at which data is transmitted in one clock domain may not match the rate at which data is used in another clock domain. Thus, to accommodate for these rate differences, the prior art utilizes a first-in-first-out ("FIFO") buffer in an interface to serve as a bridge for data to travel from one module in a first clock domain to another module in a second clock domain. Data can be clocked into the FIFO buffer according to a first clock signal of the first clock domain and clocked out of the FIFO buffer according to a second clock signal of the second clock domain.

The use of a FIFO buffer in the interface can cause a large amount of latency for transferring data between modules in different clock domains. In particular, space, power, and other resources can be expended by the FIFO buffer. Therefore, there exists a need to provide new methods and systems for interfacing clock domains that can account for any integral frequency difference, decrease latency, and reduce the amount of chip area and power used to implement such interface.

SUMMARY OF INVENTION

An object of this invention is to provide methods and systems for a low-latency write data path for a double data rate ("DDR") memory interface.

Another object of this invention is to provide methods and systems for an interface between a physical layer and a memory device without using a first-in-first-out buffer.

Yet another object of this invention is to provide methods and systems for a low-power memory interface.

Briefly, the present invention discloses a data path interface for transferring data from a physical layer to a memory device, comprising: programmable delay units ("PDUs"), wherein data is received by the interface according to a first clock signal and wherein the PDUs apply delays to the received data; and align blocks, wherein the align blocks select certain ones of the delayed data as a function of the first clock signal and a second clock signal, and wherein the selected certain ones of the delayed data are processed for transmission to the memory device according to the second clock signal.

An advantage of this invention is that methods and systems for a low-latency write data path for a double data rate memory interface are provided.

Another advantage of this invention is that methods and systems for a memory interface between a physical layer and a memory device without using a first-in-first-out buffer are provided.

Yet another advantage of this invention is that methods and systems for a low-power memory interface are provided.

DESCRIPTION OF THE DRAWINGS

The foregoing and other objects, aspects, and advantages of the invention can be better understood from the following detailed description of the preferred embodiment of the invention when taken in conjunction with the accompanying drawings in which:

FIGS. 2a-2c illustrate waveforms of signals for a data path interface of the present invention for synchronizing data bits of a write data path.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced. The present invention is disclosed in reference to a data path interface between a physical layer interface ("DFI") of a computing device and a memory device (e.g., an off-chip dynamic random-access memory ("DRAM")), where the DFI and the DRAM operate in different clock domains. However, it is understood by a person having ordinary skill in the art that the present invention can be applicable to interfacing other modules that operate in different clock domains.

Figure 1:
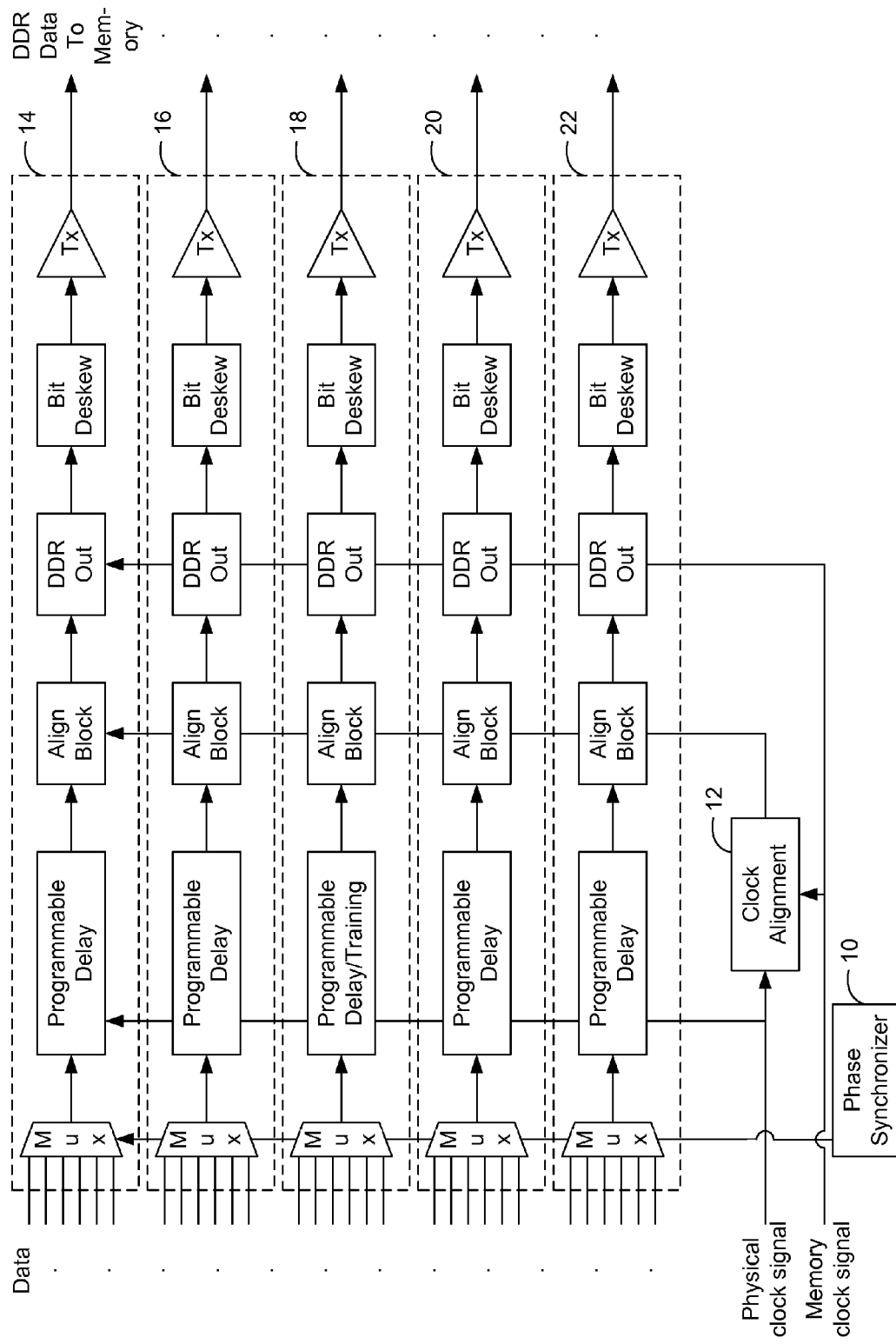
FIG. 1 illustrates a block diagram of a data path interface of the present invention between a DFI and DRAM.

FIG. 1 illustrates a block diagram of a data path interface of the present invention between a DFI and DRAM. A data path interface of the present invention can provide a data write path between a double data rate ("DDR") physical layer interface and a DRAM. The DFI protocol defines the signals, timing, and functionality required for efficient communication across the physical layer, and is known by a person having ordinary skill in the art. The DFI protocol can be found at the following webpage http://www.ddr-phy.org.

The data path interface of the present invention comprises a phase synchronizer 10, a clock alignment logic 12, and bit slicers 14-22. Each of the bit slicers 14-22 comprise of a low-setup multiplexer, a programmable delay unit, an align block, a single-bit-to-DDR data conversion unit (a "DDR out block"), a bit deskew unit, and a driver. The number of bit slicers of the data path interface can be adjusted to provide for an N-bit width data to be written from the memory controller to the DRAM. To aid in the understanding of the invention, the bit slicers 14-22 are illustrated in FIG. 1, but it is understood that there can be more bit slicers to provide for an N-bit width data.

Generally, a memory controller (not shown) provides data according to a DFI clock signal to the data path interface. The data path interface uses a physical clock signal to read data from the DFI. The data can be inputted in parallel from the DFI to the low-setup multiplexers of the bit slicers 14-22. The physical clock signal and the DFI clock signal can be phase aligned, but may operate at different frequencies. Typically, the DFI clock signal is ¼, ½, or equal to the frequency of the physical clock signal. Thus, the DFI interface may be running on 1, ½, or ¼ the frequency of memory clock signal. In order to account for such frequency ratio, data can be variably transmitted in 2, 4, 8, or other multiple bits to the data path interface. To achieve high throughput, data should be transmitted without gaps. For instance, in case of a 4:1 frequency ratio, the first two bits from the DFI can be sent first through the interface, and then any subsequent bits can follow through the interface.

The phase synchronizer 10 can provide control signals to the multiplexers of the bit slicers 14-22 to synchronize the read data from the DFI such that the read data is processed in order. The multiplexers and programmable delay units of the bit slicers 14-22 operate according to the physical clock signal. Thus, the order of data bit flow and high throughput of the interface is maintained by the phase synchronizer 10. The phase synchronizer 10 can serve as a counter to maintain the correct data flow from the multiplexers of the bit slicers 14-22 by controlling the multiplexers.

A reset pulse generated based on the DFI clock signal can reset the phase synchronizer 10. Without the reset pulse, the counting of the phases by the phase synchronizer 10 can be completely out of sync, thereby scrambling the data. Upon receiving the reset signal, the phase synchronizer 10 can reset its counter. Once the reset signal is deactivated, the counter of the phase synchronizer 10 is a free running counter, counting the rising edge of the physical clock signal in a repetitive manner. For instance, in case of a frequency ration of 4:1, the phase synchronizer 10 counts from 0, 1, 2, 3, 4, and then repeats until the counter gets reset.

The multiplexers are designed for low latency by eliminating the need of flops. The first odd/even bits are selected and placed at the end of the multiplexer logic to reduce the setup time requirement. Remaining bits are placed at appropriate locations in the multiplexer logic to reduce the hold time requirement. The multiplexer can also integrate a scan input signal SI so that the flops in the high speed data path are scannable without needing other dedicated multiplexers.

The output of the multiplexers can be inputted into respective programmable delay units. The flops of the programmable delay units are arranged in such a way that irrespective of the delay/flop counts, the delay from the input to output is less than or equal to the combined value of a multiplexer's delay and a flop clock to q delay. The programmable delay unit generates three outputs, one on a falling edge of the physical clock signal, second on a rising edge of the physical clock signal, and on a next falling edge of the physical clock signal (or the direct input of the programmable delay unit. Furthermore, the programmable delay unit can be trained by the overall system to determine an amount of delay to apply to the received data. For instance, for DRAM, the delay amount can be anywhere from 0-4 cycles of the memory clock signal, depending on the training.

The DDR out blocks, the bit deskew units, and the drivers of the bit slicers 14-22 operate according to a memory clock signal of the DRAM (not shown). Trained memory clock signal can be asynchronous to the physical clock signal. Therefore, the align blocks and the programmable delay units of the bit slicers 14-22 are used to align the data for output to the DDR out blocks of the bit slicers 14-22. In case of write, the interface aligns the data output to the memory clock signal. This can be accomplished by the programmable delay units of the bit slicers 14-22, which provide delays in units of clock cycles and partial clock cycles.

Typically, the DDR out block runs on a partially shifted memory clock signal. This can make the data transfer difficult between the programmable delay units (which run of the physical clock signal) to the DDR out blocks (which run on the memory clock signal) since the physical clock signal and the memory clock signal are in different clock domains.

However, the clock alignment logic 12 can bridge these two clock domains. The clock alignment logic 12 receives the physical clock signal and the memory clock signal, and then provides selection signals to the align blocks of the bit slicers 14-22. The align blocks of the bit slicers 14-22 select which output of its respective programmable delay unit to output to the DDR out blocks. The data is further reconstructed by the DDR out blocks of the bit slicers 14-22, and then sent out to the DRAM via the bit deskew units and the drivers of the bit slicers 14-22. The bit deskew units and the drivers of the bit slicers 14-22 can be implemented by known art.

The write data path interface can receive data on a rising edge of the DFI clock signal, which is phase synchronized with the physical clock signal PHYCLK. Generally, the data is stable until a next rising edge of the DFI clock signal. The interface can split the incoming data into odd and even bits to reduce logic and to eliminate holding flops. The even and odd data bits can go through bit slicers of the present invention, in which the DDR out blocks can recombine the even and odd data bits into DDR data.

FIG. 2a illustrates waveforms of signals for a data path interface of the present invention for synchronizing received data. In this case, a DFI clock signal (e.g., I_DFICLK signal) is $¼^{th}$ the frequency of a physical clock signal (e.g., I_PHYCLK signal). As such, data can be sent from the memory controller every DFI clock cycle (which is every four physical clock cycles) to the data path interface of the present invention. Typically, four bits of data can be sent to the data path interface for each cycle of the DFI clock signal. The physical clock signal can be used for reading the data from the DFI, adding a programmable delay unit, and/or sending the read data out to the align block.

In order to keep the bits of the read data in order, a reset signal (e.g., I_RESET) can be used to initiate a counter to track the order of data received for each cycle of the physical clock signal within a DFI clock cycle. The data path interface can read the data four times according to the physical clock signal within a single cycle of the DFI clock signal. Thus, a counter from 0-3 can be used to track the order of the read data within each of the DFI clock cycles. When a next rising edge of the DFI clock signal is detected, the counter can restart at 0,and continue counting each physical clock cycle until the next rising edge of the DFI clock signal to loop back to 0.

FIG. 2b illustrates waveforms of signals for a data path interface of the present invention for synchronizing received data. In this case, a DFI clock signal (e.g., I_DFICLK signal) is ½ the frequency of a physical clock signal (e.g., I_PHYCLK signal). As such, data can be sent from the memory controller every DFI clock cycle (which is every two physical clock cycles) to the data path interface of the present invention. Typically, eight bits of data can be sent to the data path interface for each cycle of the DFI clock signal. The physical clock signal can be used for reading the data from the DFI, adding a programmable delay unit, and/or sending the read data out to the align block.

Figure 4:
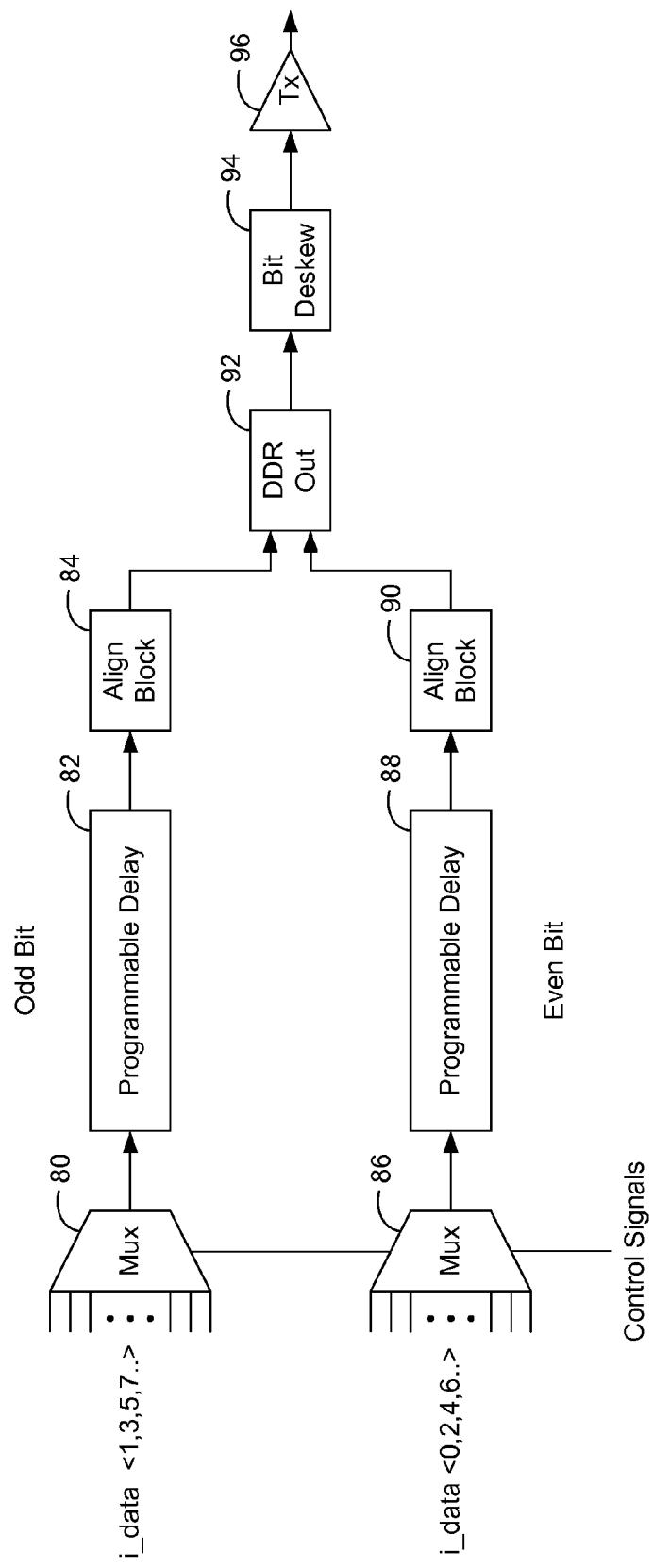
FIG. 4 illustrates a block diagram of a single DDR data slicer of the present invention.

In order to keep the bits of the read data in order, a reset signal (e.g., I_RESET) can be used to initiate a counter to track the order of data received for each cycle of the physical clock signal within a DFI clock cycle. The data path interface can read the data two times according to the physical clock signal within a single cycle of the DFI clock signal. Thus, a counter from 0-1 can be used to track the order of the read data within each of the DFI clock cycles. When a next rising edge of the DFI clock signal is detected, the counter can restart at 0, and continue counting each physical clock cycle until the next rising edge of the DFI clock signal to loop back to 0. DDR out block recombines the data for output to the DRAM. The bit deskew outputs the DDR data so that the data is received in the DRAM (as shown in FIG. 4).

Figure 2C:
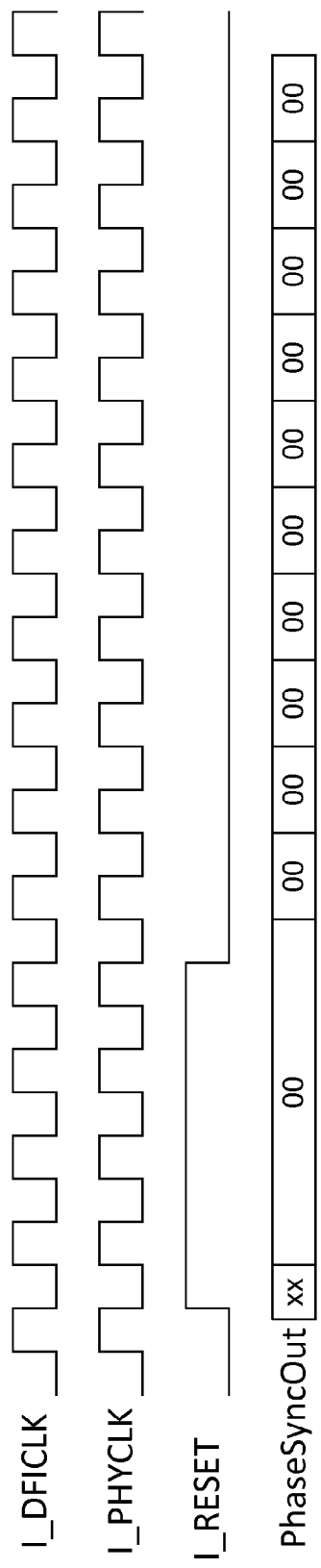

FIG. 2c illustrates waveforms of signals for a data path interface of the present invention for synchronizing received data. In this case, a DFI clock signal (e.g., I_DFICLK signal) is equal to the frequency of a physical clock signal (e.g., I_PHYCLK signal). Here, data can be sent from the memory controller every DFI clock cycle (which is also every physical clock cycle) to the data path interface of the present invention. Since the frequencies are the same, the counter can be optional or merely set to zero.

Figure 3A:
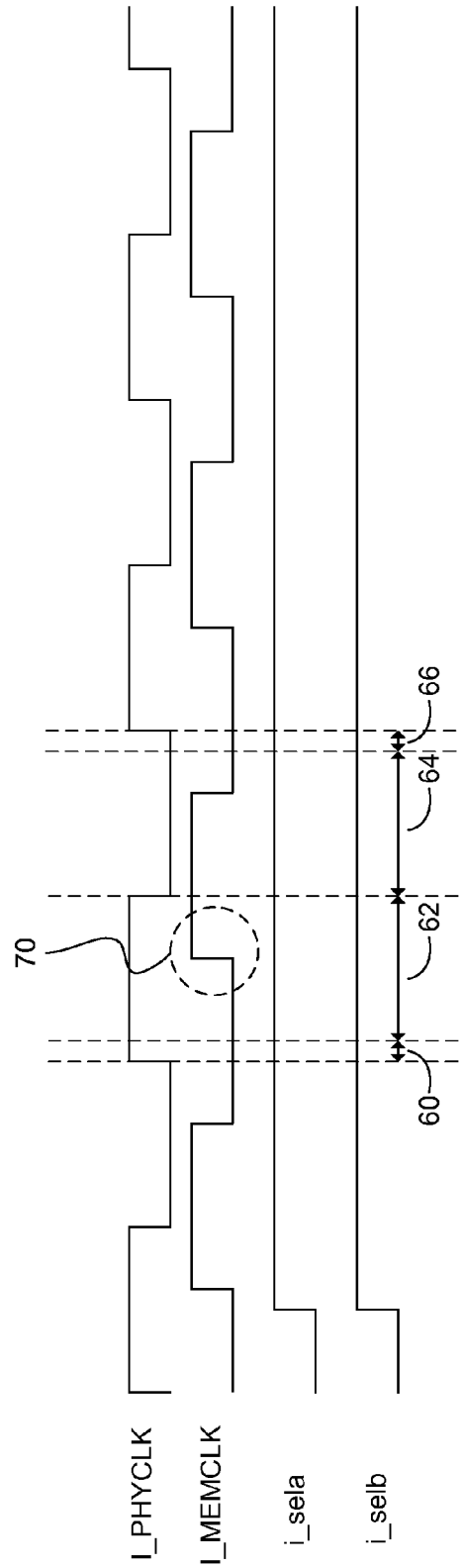
FIGS. 3a-3c illustrate waveforms of signals for a data path interface of the present invention for generating control signals.

FIG. 3a illustrates clock signals and selection signals for an interface of the present invention. The clock alignment logic 12 can detect the rising and the falling edges of the physical clock signal and the memory clock signal. Depending on where the rising edges of the physical clock signals and the memory clock signals are located along a time axis relative to each other, the clock alignment logic 12 can generate selection signals a and b to be outputted to the align blocks of the bit slicers 14-22. The align blocks of the bit slicers 14-22 further use the selection signals a and b to select an input from its respective programmable delay unit to output to the DDR out blocks.

The physical clock signal can be partitioned into several regions in which if the rising edge of a memory clock signal falls in a particular region, the clock alignment logic 12 can set the selections signals a and b accordingly. For instance, four regions 60-66 within a cycle of the physical clock signal can be used for determining what to set the selection signals a and b to. The boundaries of the regions can be determined by the number of units that a cycle of the physical clock signal can be partitioned in to. In one example, the cycle can be partitioned into 128 units of equal size starting from the rising edge of the cycle of the physical clock signal to the next rising edge of the physical clock signal. The first region 60 can be from 0-15 units of the cycle, the second region 62 can be from 16-63 units of the cycle, the third region 64 can be from 64-112 units of the cycle, and the fourth region 66 can be from 112-128 units of the cycle.

For the case where a rising edge 70 of the memory clock signal is in the regions 60 or 62, i.e., between a rising edge and falling edge of the physical clock signal, then selection signals a and b can be both set to a high state. The align blocks of the bit slicers 14-22 can select a first delayed signal of the data from its respective programmable delay unit according to the selection signals a and b. Typically, the first delayed signal is delayed N–0.5 cycles of the physical clock signal, where N is determined by training and is an integer value.

Figure 3B:
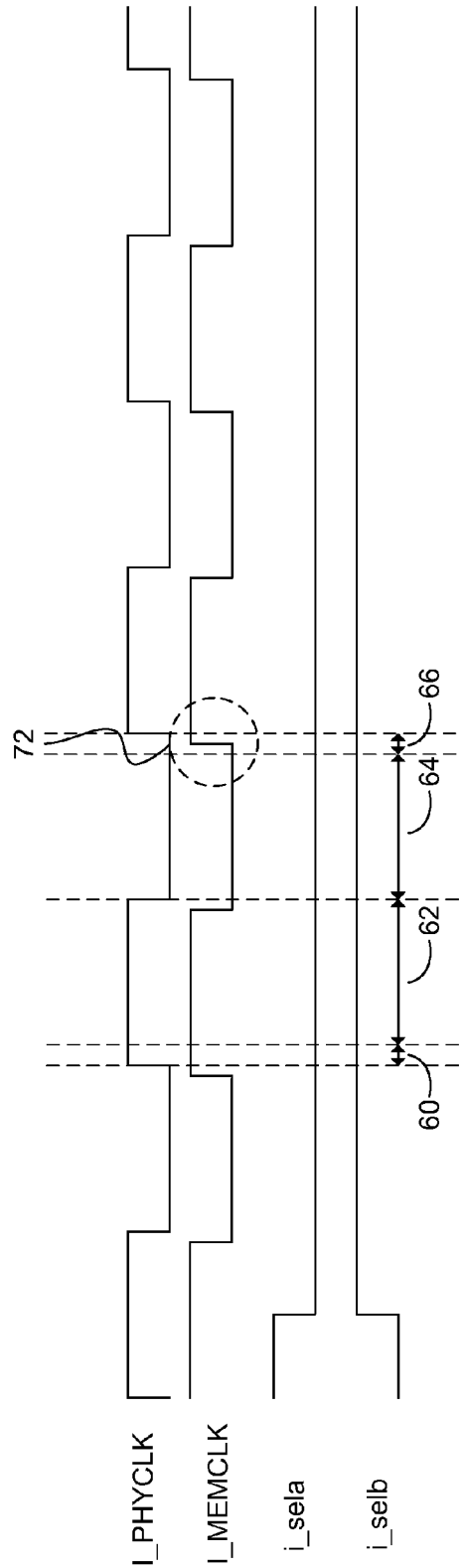

FIG. 3b illustrates clock signals and selection signals for an interface of the present invention. In a second case, when a rising edge 72 of the memory clock signal is in the fourth region 66, i.e., right before second falling edge of the physical clock signal, then the selection signal a is set to a low state and the selection signal b is set to a high state. The align block of the bit slicers 14-22 then use the selection signals to select a second delayed signal of the data from its respective programmable delay unit. Typically, the second delayed signal is delayed N+0.5 cycles of the physical clock signal, where N is determined by training and is an integer value.

Figure 3C:
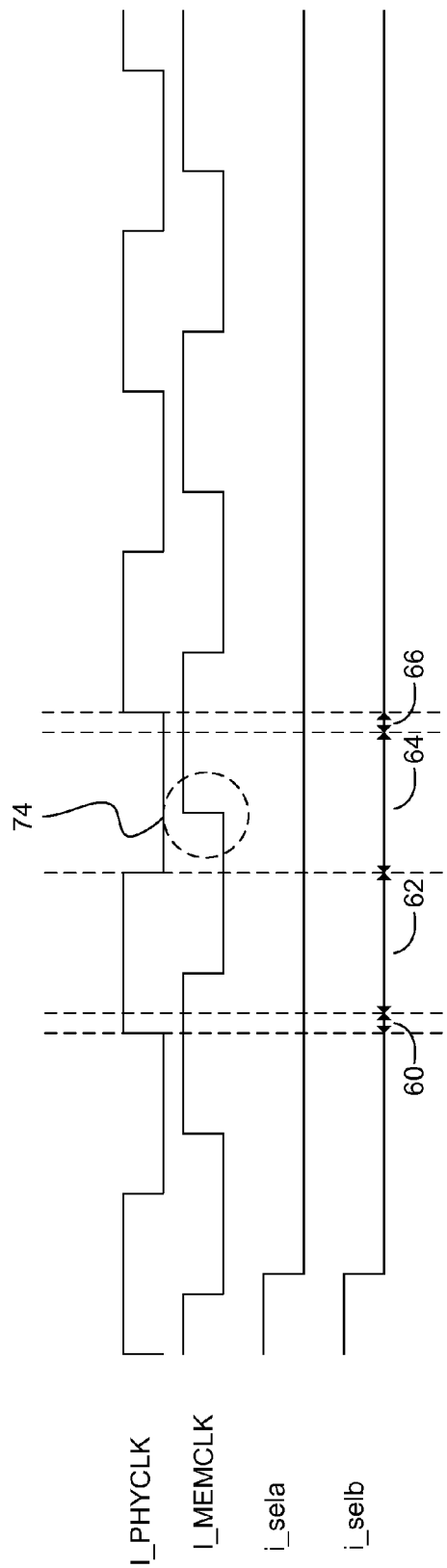

FIG. 3c illustrates clock signals and selection signals for an interface of the present invention. In another case, when a rising edge 74 of the memory clock signal is in the third region 64, then the selection signals a and b are set to a low state. The align block of the bit slicers 14-22 then use the selection signals to select a third delayed signal of the data from its respective programmable delay unit. Typically, the third delayed signal is delayed N cycles of the physical clock signal, where N is determined by training and is an integer value.

FIG. 4 illustrates a bit slicer of the present invention having DDR data being inputted to the bit slicer. In an alternative embodiment of the present invention, each bit slicer of the interface of the present invention can comprise two low-setup multiplexers 80 and 86, two programmable delay units 82 and 88, two align blocks 84 and 90, a DDR out block 92, a bit deskew unit 94, and a transmitter 96.

Typically, odd and even DDR data can be split such that the odd data i_data<1, 3, 5, 7, . . . > can be inputted to the multiplexer 80 and the even data i_data<2, 4, 6, 8, . . . > can be inputted to the multiplexer 86. The multiplexer 80 sequentially selects the odd data to be outputted to the programmable delay unit 82. Control signals can be inputted to the multiplexer 80 such that the odd data is sequentially selected in order so that the data is not scrambled. The programmable delay unit 82 provides various delayed signals of the inputted odd data to the align block 84. Based upon the relative positions of the phases of the physical clock signal and the memory clocks signal, the align block 84 can select one of the delayed signals of the odd data to output of the DDR out block 92.

Likewise, the multiplexer 86 sequentially selects the even data to be outputted to the programmable delay unit 88. Control signals can be inputted to the multiplexer 86 such that the even data is sequentially selected in order so that the data is not scrambled. The programmable delay unit 88 provides various delayed signals of the inputted even data to the align block 90. Based upon the relative positions of the phases of the physical clock signal and the memory clocks signal, the align block 90 can select one of the delayed signals of the even data to output to the DDR out block 92.

The DDR out block 92 recombines the even and the odd data into DDR data. The recombined DDR data is written to the DRAM (or other memory device) via the bit deskew unit 94 and the transmitter 96.

Figure 5:
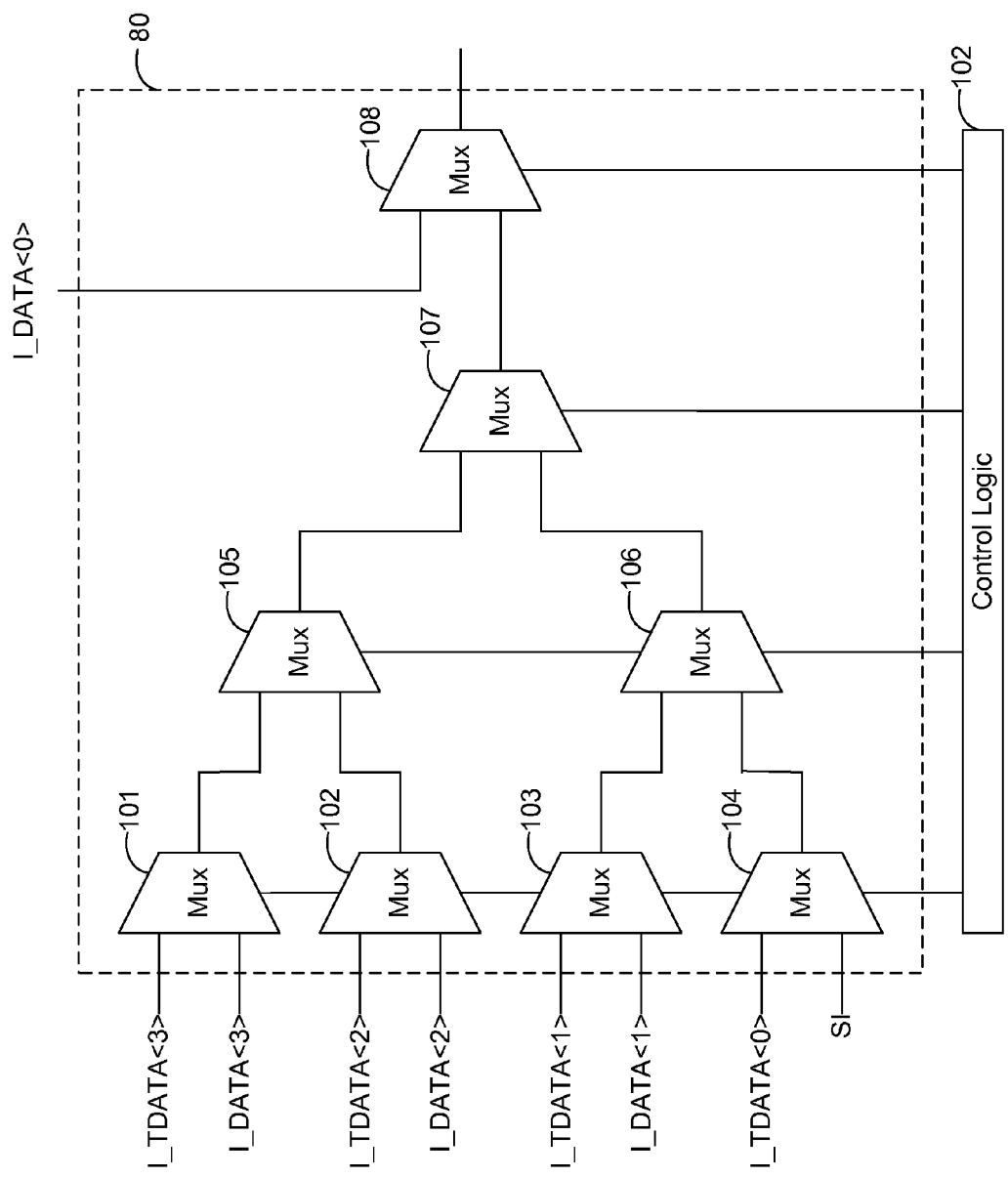
FIG. 5 illustrates a low-setup multiplexer of the present invention for outputting synchronized data bits.

FIG. 5 illustrates a low-setup multiplexer of the present invention for outputting synchronized data bits. A low-setup multiplexer of the present invention can be used in an interface of the present invention for providing sequential outputs of inputted data bits. For instance, the low-setup multiplexer 80 can comprise multiple binary multiplexers 101-108, which are connected in a tree-like structure for selecting a single data bit to output. The final multiplexer 108 can have two inputs, where a first bit of data I_DATA<0> is directly inputted to the last multiplexer 108. The second input of the multiplexer 108 can be for the remaining bits of data I_DATA<1:3> and I_TDATA<0:3> from the other multiplexers 101-107 in the tree-like structure. In addition, a scan input signal SI can be inputted to one of the multiplexers 101-108 so that the flops in the high speed data path can be scan enabled. A control logic 102 can input control signals to the multiplexers 101-108 for selecting the data bits in sequence for output. For instance, the first bit I_DATA<0> can be selected first for output, and then the remaining data bits can be selected sequentially for output.

Figure 6:
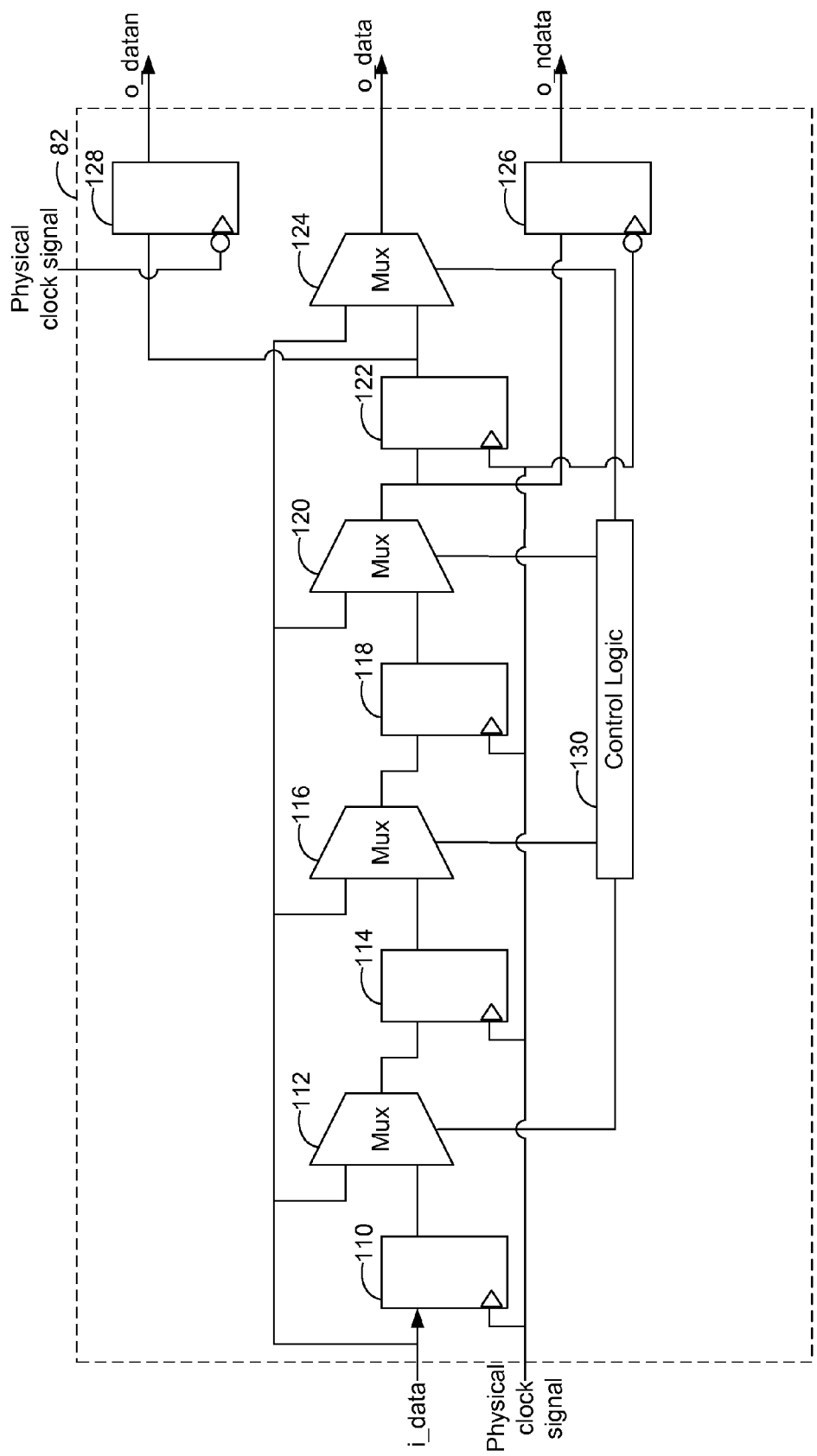
FIG. 6 illustrates a programmable delay unit of the present invention.

FIG. 6 illustrates a programmable delay unit for a data interface of the present invention. It is understood by person having ordinary skill in the art that additional multiplexers, flops, or other equivalent ICs can be used in the programmable delay unit of the present invention to provide for varying amounts of delay in accordance with the present invention. In this example, the programmable delay unit 82 of the present invention can comprise control logic 130, multiplexers 112, 116, 120 and 124, and flops 110, 114, 118, 122, 126, and 128. The flops 110, 114, 118, 122, 126, and 128 are clocked by the physical clock signal. The flops 110, 114, 118, and 122 can be positive edge flops and the flops 126 and 128 can be negative edge flops. The multiplexers 112, 116, 120, and 124 are controlled by the control logic 130.

An input signal i_data is inputted to the flop 110 and the multiplexers 112, 116, 120, and 124. The output of the flop 110 is inputted to the multiplexer 112. The output of the multiplexer 112 is connected to the flop 114. The output of the flop 114 is inputted to the multiplexer 116. The output of the multiplexer 116 is connected to the input of the flop 118. The output of the flop 118 is inputted to the multiplexer 120. The output of the multiplexer 120 is connected to the flop 122. The output of the flop 122 is inputted to the multiplexer 124. The output of the multiplexer 124 provides a delay data signal o_data. Typically, the delay data signal o_data is delayed by N cycles of the physical clock signal. The number of cycles N to be delayed can be predetermined by training.

Furthermore, the output of the multiplexer 120 is inputted to the flop 126. The flop 126 outputs the delay data signal o_ndata. The delay data signal o_ndata can be delayed a half cycle of the physical clock signal shorter than the delayed amount for the delay signal o_data. The output of the flop 122 is also inputted to the flop 128. The flop 128 outputs the delayed signal o_datan. The delay data signal o_datan can be delayed a half cycle of the physical clock signal longer than the delayed amount of the delay signal o_data.

Figure 7:
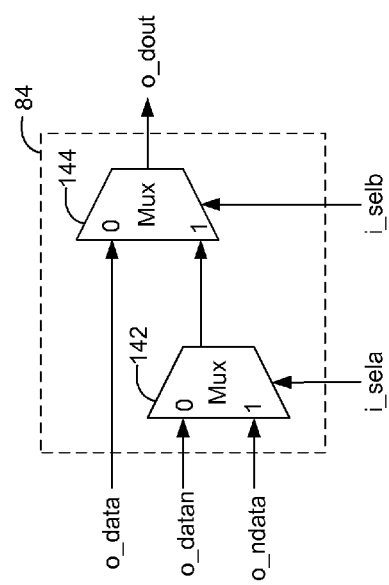
FIG. 7 illustrates an align block for a data interface of the present invention.

FIG. 7 illustrates an align block for a data interface of the present invention. The align block 84 of the present invention comprises multiplexers 142 and 144. The multiplexers 142 and 144 are controlled by selection signals i_sela and i_selb that are respectively inputted to the multiplexers 142 and 144. The selection signals i_sela and i_selb can be generated by a clock alignment logic of the present invention.

The three outputs o_ndata, o_data, and o_datan from a programmable delay unit of the present invention can be inputted to the multiplexers 142 and 144 for selection. For example, the delayed signals o_datan and o_ndata are inputted to the multiplexer 142. When the selection signal i_sela is in a low state, then the multiplexer 142 selects the o_datan. When the selection signal i_sela is in a high state, then the multiplexer 142 selects the o_ndata.

The output of the multiplexer 142 and the o_data signal are inputted to the multiplexer 144. When the selection signal i_selb is in a high state, then the multiplexer 144 selects the output of the multiplexer 142 to output. When the selection signal i_selb is in a low state, then the multiplexer 144 selects the o_data signal.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A data path interface for transferring data to a memory device, comprising:
   programmable delay units ("PDUs"), wherein data is received by the data path interface according to a first clock signal and wherein the PDUs apply delays to the received data;
   align blocks; and
   a clock alignment logic,
   wherein the align blocks select certain ones of the delayed data as a function of the first clock signal and a second clock signal,
   wherein the selected certain ones of the delayed data are processed for transmission to the memory device according to the second clock signal,
   wherein the clock alignment logic determines relative edge positions of the first clock signal and the second clock signal along a time axis,
   wherein the selected certain ones of the delayed data are selected as a function of the determined edge positions,
   wherein a cycle of the first clock signal is partitioned into predefined regions along the time axis, and
   wherein an amount of delay of the selected certain ones of the delayed data is a function of where a rising edge of the second clock signal falls within the predefined regions along the time axis.

2. The data path interface of claim 1 wherein if the rising edge of the second clock signal falls within a first region of the predefined regions, the amount of delay is equal to N−0.5 cycles of the second clock signal, where N is an integer.

3. The data path interface of claim 1 wherein if the rising edge of the second clock signal falls within a second region of the predefined regions, the amount of delay is equal to N cycles of the second clock signal, where N is an integer.

4. The data path interface of claim 1 wherein if the rising edge of the second clock signal falls within a third region of the predefined regions, the amount of delay is equal to N+0.5 cycles of the second clock signal, where N is an integer.

5. The data path interface of claim 1 further comprising multiplexers for receiving the received data from a physical layer and a phase synchronizer for managing the multiplexers, wherein the phase synchronizer selects a bit order for outputting the received data from the multiplexers to the PDUs.

6. The data path interface of claim 5 wherein each of the multiplexers is a low-setup multiplexer, wherein the low-setup multiplexer comprises binary multiplexers connected together in a tree structure, and wherein a first data bit is routed directly to a final one of the binary multiplexers and remaining data bits are routed through the other ones of the binary multiplexers.

7. A data path interface for transferring data to a memory device, comprising:
   programmable delay units ("PDUs"), wherein data is received by the data path interface according to a first clock signal and wherein the PDUs apply delays to the received data;
   align blocks, wherein the align blocks select certain ones of the delayed data as a function of the first clock signal and a second clock signal;
   a clock alignment logic;
   multiplexers for receiving the received data from a physical layer; and
   a phase synchronizer for managing the multiplexers, wherein the phase synchronizer selects a bit order for outputting the received data from the multiplexers to the PDUs, wherein the selected certain ones of the delayed data are processed for transmission to the memory device according to the second clock signal, wherein the clock alignment logic determines relative edge positions of the first clock signal and the second clock signal along a time axis, and wherein the selected certain ones of the delayed data are selected as a function of the determined edge positions.

8. The data path interface of claim 7 wherein a cycle of the first clock signal is partitioned into predefined regions along the time axis and wherein an amount of delay of the selected certain ones of the delayed data is a function of where a rising edge of the second clock signal falls within the predefined regions along the time axis.

9. The data path interface of claim 8 wherein if the rising edge of the second clock signal falls within a first region of the predefined regions, the amount of delay is equal to N−0.5 cycles of the second clock signal, where N is an integer.

10. The data path interface of claim 8 wherein if the rising edge of the second clock signal falls within a second region of the predefined regions, the amount of delay is equal to N cycles of the second clock signal, where N is an integer.

11. The data path interface of claim 8 wherein if the rising edge of the second clock signal falls within a third region of the predefined regions, the amount of delay is equal to N+0.5 cycles of the second clock signal, where N is an integer.

12. The data path interface of claim 7 wherein each of the multiplexers is a low-setup multiplexer, wherein the low-setup multiplexer comprises binary multiplexers connected together in a tree structure, and wherein a first data bit is routed directly to a final one of the binary multiplexers and remaining data bits are routed through the other ones of the binary multiplexers.

13. A data path interface for transferring data to a memory device, comprising:

programmable delay units ("PDUs"), wherein data is received by the data path interface according to a first clock signal and wherein the PDUs apply delays to the received data;

align blocks, wherein the align blocks select certain ones of the delayed data as a functior of the first clock signal and a second clock signal;

a clock alignment logic;

multiplexers for receiving the received data from a physical layer; and a phase synchronizer for managing the multiplexers, wherein the phase synchronizer selects a bit order for outputting the received data from the multiplexers to the PDUs, wherein the selected certain ones of the delayed data are processed for transmission to the memory device according to the second clock signal, wherein the clock alignment logic determines relative edge positions of the first clock signal and the second clock signal along a time axis, wherein the selected certain ones of the delayed data are selected as a function of the determined edge positions, wherein a cycle of the first clock signal is partitioned into predefined regions along the time axis, wherein an amount of delay of the selected certain ones of the delayed data is a function of where a rising edge of the second clock signal falls within the predefined regions along the time axis, wherein if the rising edge of the second clock signal falls within a first region of the predefined regions, the amount of delay is equal to N−0.5 cycles of the second clock signal, where N is an integer, wherein if the rising edge of the second clock signal falls within a second region of the predefined regions, the amount of delay is equal to N cycles of the second clock signal, where N is an integer, and wherein if the rising edge of the second clock signal falls within a third region of the predefined regions, the amount of delay is equal to N+0.5 cycles of the second clock signal, where N is an integer.

14. The data path interface of claim 13 wherein each of the multiplexers is a low-setup multiplexer, wherein the low-setup multiplexer comprises binary multiplexers connected together in a tree structure, and wherein a first data bit is routed directly to a final one of the binary multiplexers and remaining data bits are routed through the other ones of the binary multiplexers.

* * * * *